United States Patent
Petrenko et al.

(10) Patent No.: US 9,136,778 B2
(45) Date of Patent: Sep. 15, 2015

(54) NON-MAGNETIC HIGH-SPEED PIEZOELECTRIC ROTARY MOTOR

(71) Applicant: DISCOVERY TECHNOLOGY INTERNATIONAL, INC., Sarasota, FL (US)

(72) Inventors: Serhiy Petrenko, Kiev (UA); Valentin R. Zhelyaskov, Sarasota, FL (US)

( * ) Notice: Subject to any disclaimer, the term of this patent is extended or adjusted under 35 U.S.C. 154(b) by 316 days.

(21) Appl. No.: 13/778,330

(22) Filed: Feb. 27, 2013

(65) Prior Publication Data
US 2013/0221803 A1 Aug. 29, 2013

Related U.S. Application Data

(60) Provisional application No. 61/604,573, filed on Feb. 29, 2012.

(51) Int. Cl.
| | |
|---|---|
| *H02N 2/12* | (2006.01) |
| *H02N 2/16* | (2006.01) |
| *H01L 41/09* | (2006.01) |
| *H02N 2/00* | (2006.01) |
| *H02N 2/10* | (2006.01) |

(52) U.S. Cl.
CPC ............ *H02N 2/123* (2013.01); *H01L 41/0913* (2013.01); *H02N 2/0055* (2013.01); *H02N 2/0065* (2013.01); *H02N 2/103* (2013.01); *H02N 2/16* (2013.01)

(58) Field of Classification Search
USPC ............... 310/311, 323.01–323.19, 328, 359, 310/367, 368
See application file for complete search history.

(56) References Cited

U.S. PATENT DOCUMENTS

| | | | | | |
|---|---|---|---|---|---|
| 4,928,030 | A | * | 5/1990 | Culp | 310/328 |
| 5,068,566 | A | * | 11/1991 | Culp | 310/328 |
| 5,237,236 | A | * | 8/1993 | Culp | 310/317 |
| 2005/0006983 | A1 | * | 1/2005 | Witteveen | 310/323.01 |
| 2005/0184621 | A1 | * | 8/2005 | Kitahara et al. | 310/311 |
| 2007/0188050 | A1 | * | 8/2007 | Hashimoto | 310/323.02 |
| 2008/0192584 | A1 | * | 8/2008 | Yamazaki | 368/168 |
| 2008/0212415 | A1 | * | 9/2008 | Nagao | 368/204 |

\* cited by examiner

*Primary Examiner* — Thomas Dougherty

(74) *Attorney, Agent, or Firm* — Robert J. Sacco, Esq.; Fox Rothschild LLP

(57) ABSTRACT

A piezoelectric motor including a rotor and a piezoelectric actuator positioned relative to the rotor in such manner that a working end of the actuator is in linear, frictional, resilient and forced contact with a working surface of the rotor. The actuator includes a piezoelectric a longitudinal prism shaped resonator with a trapezoidal cross-section and the working end of the actuator is a flat pusher insert set at an angle to the plane of the resonator base. An electronic generator is connected to electrodes of the piezoelectric actuator to excite periodic mechanical oscillations in the actuator wherein the electrodes are applied onto the longitudinal lateral trapezoidal surfaces of the resonator and the piezoelectric resonator is polarized across its width and the electronic generator outputs an alternating electrical voltage signal at a frequency matching the frequency of the first-order natural longitudinal mode of mechanical oscillation along the length of the resonator.

25 Claims, 3 Drawing Sheets

NON-MAGNETIC HIGH-SPEED PIEZOELECTRIC ROTARY MOTOR

CROSS REFERENCE TO RELATED APPLICATIONS

This application claims the benefit of U.S. Provisional Application No. 61/604,573 filed on Feb. 29, 2012, the contents of which are incorporated herein.

FIELD OF THE INVENTION

This invention relates to ultrasonic piezoelectric motors with one or more piezoelectric actuators having linear engagement with the rotor. Such motors may have broad usage in diverse areas of science and technology (e.g. medicine, automation, computer technologies, aircraft, space technologies, automobiles, toys, etc.). Such motors may be readily used as non-magnetic motors in various instruments of special applications, where non-magnetic devices are a requirement.

BACKGROUND OF THE INVENTION

Ultrasonic piezoelectric motors are widely known, and may conveniently be categorized into two major groups: piezoelectric motors with traveling acoustic waves and piezoelectric motors with standing acoustic waves. In the first case, the engagement of the piezoelectric actuator with the rotor is effected over a large surface, and such motors are identified as motors with surface contact. In the second category, the engagement of the piezoelectric actuator with the rotor is effected over a rectangular surface of small width, and these piezomotors are identified as motors with basically a line or point contact. The working/contact ends of such actuators move in an elliptical path in which, during part of this movement, the contact ends engage the rotor of the motor and during the rest of the movement they disengage and retract to an initial starting position. Such motors are disclosed in U.S. Pat. Nos. 4,019,073; 4,400,641; 4,453,103; 4,959,580, which are incorporated herein by reference.

U.S. Pat. No. 6,242,850 B1, also incorporated herein by reference, discloses a motor with a planar piezoelectric actuator and engagement with the rotor along a contact line. This motor comprises one or more actuators arranged around the rotor. Each actuator has at least one piezoelectric resonator, generating mechanical oscillation and with the working end directly pushing so as to rotate the rotor. Thus, the mechanical periodic oscillations of each resonator apply pressure to the rotor. The pressure applied does not exceed the natural elastic limit of the rotor, so that after each successive depression the rotor surface would restore completely to its initial state. This control of pressure applied to the rotor extends the service life of the motor, and is achieved by appropriate selection of the relative hardness characteristics of the rotor and the working end of the actuator.

Thus, in the motor of the prior art, the task of extending the motor life is achieved by improving wear resistance of the parts that are subject to applied forces and necessary friction i.e. the actuator working end and the rotor.

In such systems, issues relating to catastrophic failure, i.e. cracking of the piezoelectric actuator, are neglected. The actuator of the prior art motor illustrated in U.S. Pat. No. 6,242,850 B1 is generally made of a thin flat rectangular piezoelectric element, which acts as a piezo resonator polarized across its width. In order to ensure the necessary elliptical path for the motion of the actuator working end, frictionally engaged along the contact line with the rotor, such a motor is generally excited at a frequency close to the first longitudinal mode of mechanical oscillation across the length of the resonator. Moreover, the thickness of the resonator is chosen in such a way that a bending mode of oscillation is simultaneously excited, which is matched in frequency and phase to the longitudinal mode. This is achieved by selecting an appropriate ratio of length to thickness. In general, with an actuator 50 to 70 mm long, its thickness is in the order of several millimeters in order to satisfy the above requirement. The superposition of these two orthogonal oscillations determines the nano-elliptical motion path of the contact line (or point). During the motor operation, very often, a situation can arise when the actuator separates from the rotor for a few milliseconds (e.g. due to internal or external vibration, poor contact owing to dissimilarity between the materials of the rotor and of the actuator working end, wobble of the rotor, etc.).

For the brief duration of the separation, the actuator becomes load-free. As a result, the amplitude of the resonator oscillations increase (i.e. its quality factor "Q" increases). The resulting increased mechanical stress can cause cracking of the resonator element.

Because the maximum mechanical strain in the system is at its center (owing to the first longitudinal mode), the piezoelectric element can break in the area close to its center. The probability of such failures increases with increasing power of the motor, or its angular speed of rotation, which sharply decreases the energy efficiency of the motor and does not allow attaining the required mechanical parameters when the electric power of the motor is increased.

In prior art piezomotor design, an increase of torque is problematic because it is known that in order to increase the torque, in the first place, an increase of the pressure of the actuator against the rotor must be effected by increasing spring tension. Because the surface of the rotor of the prior art is elastic, the increased spring tension will increase the initial depression of the rotor surface, possibly leading to plastic deformation of the rotor. This would sharply decrease the system's efficiency, reduce the torque and eventually result in jamming of the motor.

BRIEF SUMMARY OF THE INVENTION

It is desirable in one or more of the embodiments of the invention to increase the reliability, power efficiency and/or torque of the motor.

The piezoelectric motor in accordance with at least one embodiment of the invention includes a rotor, with an outer working cylindrical surface, set in bearing guides on the motor base; a piezoelectric actuator set on the motor base and positioned relative to the rotor with its working end in linear, frictional, elastic and forced contact with the working surface of the rotor; and an electronic generator connected to the electrodes of the piezoelectric actuator to excite periodic mechanical oscillations in the actuator. Additionally, the piezoelectric actuator includes a thick, piezoelectric resonator made in the shape of longitudinal prism with a trapezoidal cross-section and the electrodes are applied onto the longitudinal, lateral surfaces of the trapezoidal resonator. The piezoelectric resonator is polarized across the thickness, parallel to the resonator base. The working end of the actuator is a flat pusher insert, set at an angle to the plane of the resonator base. The electronic generator outputs an alternating electrical voltage signal at a frequency matching the frequency of the first-order natural longitudinal mode of mechanical oscillation along the length of the resonator.

The motor of the various embodiments of the present invention may include one or more of the following features:

The pusher is set at an angle close to 135° with respect to the plane of the resonator base;

The pusher is made of a paper-based laminate (e.g. phenolic paper), and the rotor is made of steel;

The piezoelectric actuator is mounted on the base and positioned relative to the rotor with the aid of an elastic rotational suspension;

The suspension is in the form of a cantilever stand secured to the base by a cylindrical rod screwed into the base, and a holder/clamp for the actuator into which the opposite end of the rod is secured;

The position of the cantilever rod is set to enable positioning of the actuator to engage the rotor axially, while retaining the rotational degree of freedom of the actuator;

The piezoelectric actuator is held fast in the holder/clamp at the centre through sound-insulating or soundproof gaskets, e.g. made of foamed polyurethane, with the capability of pre-positioning the actuator in direction orthogonal to the rotor axis;

Frictional elastic engagement of the pusher and the rotor is provided for by a pulling spring having one end attached to the base and its other end secured to the rotational holder;

The piezoelectric actuator is positioned with respect to the rotor so that the angle between the flat pusher and a plane tangent to the rotor surface at the line of engagement is close to 90°;

Three actuators are mounted on the base positioned relative to one common rotor;

Each piezoelectric actuator is positioned so that the pushers are at an angle of 120° relative to one another;

The rotor carries an inertial load in the form of a cylindrical flywheel;

The base is in the form of a round flat elastic membrane;

Each actuator is associated with its own independent electronic generator designed for fine-tuning the frequency of the electric excitation signal to match the parameters of the entire system; and All the components of the motor are made of non-magnetic materials.

DETAILED DESCRIPTION OF THE INVENTION

Figure 1:
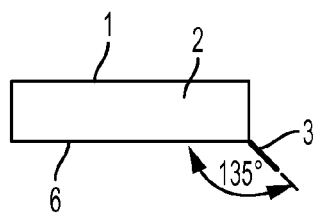
FIG. 1. is a side elevation view of an exemplary piezoelectric trapezoidal actuator of an exemplary embodiment of a motor in accordance with an embodiment of the invention.
Figure 2:
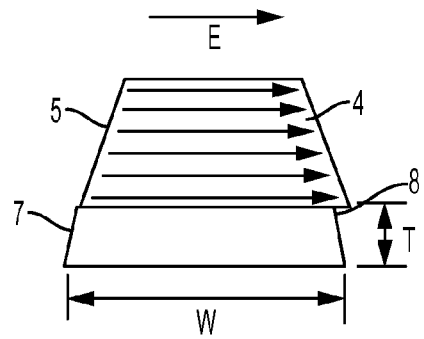
FIG. 2 is an end elevation view of the piezoelectric actuator of FIG. 1.

FIGS. 1 and 2 illustrate an exemplary piezoelectric actuator 1 including a piezoelectric trapezoidal resonator 2 having a base surface 6 and lateral longitudinal surfaces 7, 8. A flat pusher 3 extends from a free end of the resonator 2. The pusher 3 is preferably made of a paper-based laminate (e.g. phenolic paper) and set at an angle of approximately 135° to the plane of the base 6 of the resonator 2. Excitation electrodes 4, 5 are applied onto the lateral longitudinal surfaces 7, 8 of the resonator 2, with the polarization vector $\vec{E}$ being parallel with the base 6. As shown in the figures, the base 6 of the resonator 2 has a width W greater than or equal to the thickness T of the resonator 2. Preferably the ratio of the width W to the thickness T is as follows: $1 < W/T < 4$.

The actuator in the motor of the prior art was made of a thin longitudinal flat rectangular plate in which in addition to a longitudinal mode of vibration, a bending mode was excited. The latter affected substantially the reliability of the actuator of the prior art. The disclosed actuator 1 in the current invention having a thickness T to width W ratio as indicated above provides a thick and strong resonator 2 in the shape of a longitudinal trapezoidal prism. As a result, the bending mode of oscillation of this resonator 2 is created by the different degrees of longitudinal deformation along its upper and lower surfaces. This is due to the fact that the degree of polarization (formed in the polarization process of the piezoelement) with this arrangement of electrodes is greater at and near the upper surface to which the electrodes are connected. As a result, this actuator 1 is strained more along the top surface and acts like a bimorph plate.

Figure 3A:
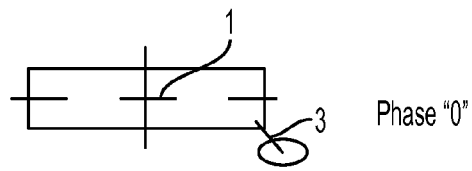
FIGS. 3A-3C schematically illustrate the oscillating motion of the exemplary piezoelectric actuator.
Figure 3B:
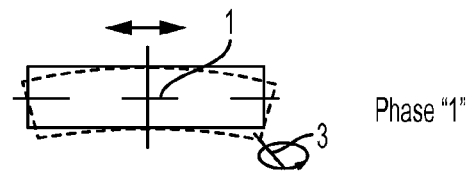
Figure 3C:
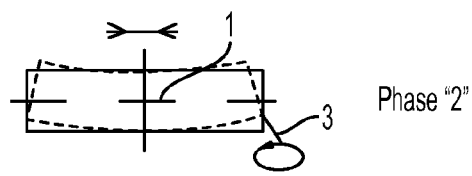

Thus, as shown in FIGS. 3A-3C, if we define as "phase 0" the initial phase of oscillation of this system (FIG. 3A), then in "phase 1" (extension of the upper surface) the pusher 3 would be pressed against the rotor and push it into rotation (FIG. 3B), and in "phase 2" (compression of the upper surface) the pusher 3 would be lifted above the surface of the rotor and would be retracted to the opposite side of the elliptical trajectory (FIG. 3C). So, when this trapezoidal resonator 2 is excited, longitudinal and bending mechanical modes of oscillation are excited in the system simultaneously, and the interaction of these modes results in ellipsoidal oscillation of the contact point (line).

Figure 4:
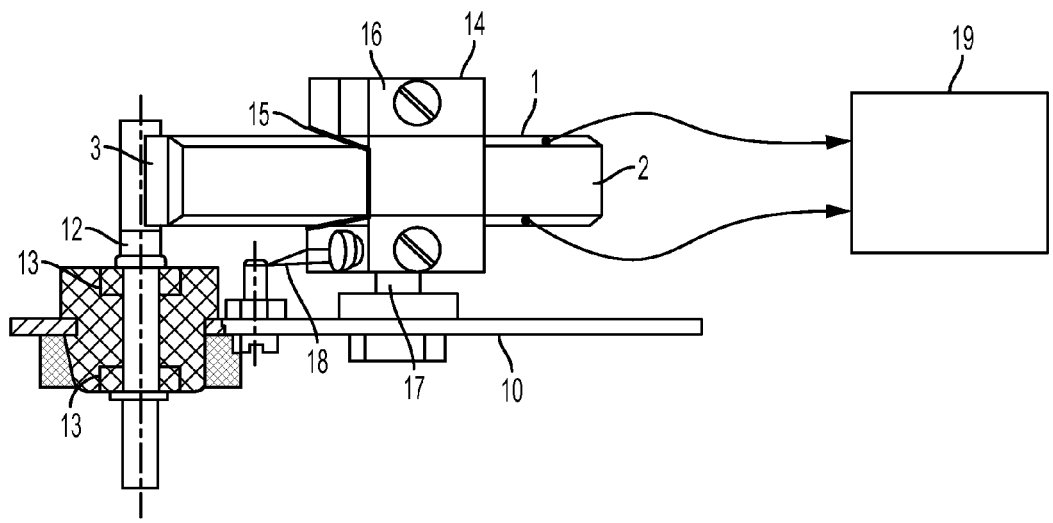
FIG. 4 is a side elevation view of a motor in accordance with an exemplary embodiment of the invention with the rotor engaged by a single actuator.
Figure 5:
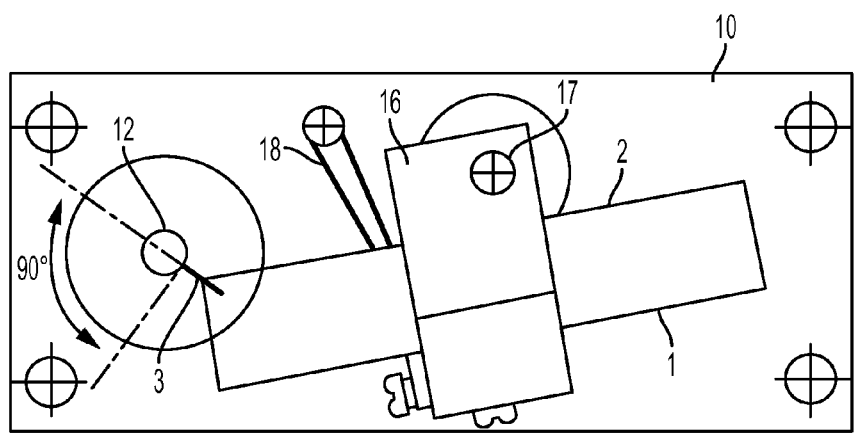
FIG. 5 is a top plan view of the motor of FIG. 4.

FIG. 4 shows a piezoelectric motor including base 10, piezoelectric actuator 1 whose flat pusher 3 frictionally acts on the rotor, i.e. cylindrical shaft 12 which is supported on base 10 in bearings 13. The piezoelectric actuator 1 is secured in rotational suspension 14 through sound-insulating gaskets 15. The rotational cantilever suspension 14 includes holder 16 (exemplarily made of two parts screwed together) which holds piezoelectric resonator 2 and a resilient threaded rod 17 having one end secured to the base 10, with the holder 16 being screwed onto the rod 17. Holder 16 is positioned on and able to rotate about rod 17, so that the actuator 1 on the rod can be positioned axially with respect to the rotor 12. The pusher 3 of the actuator 1 is frictionally pressed by the spring 18 against the working surface of the rotor 12, with the piezoelectric resonator 2 being connected via electrodes 4, 5 to a generator 19 of electric excitation. The generator 19 output is a voltage alternating at a frequency corresponding to the frequency of the first-order natural longitudinal mode of mechanical oscillation along the length of the resonator.

When an alternating electric signal at a frequency $v_1$ of the first-order natural longitudinal mode of mechanical oscillation ($v_1 = c/2l$ where c is the propagation velocity of sound waves in the resonator and l is the longitudinal length) is applied to the piezoelectric resonator 2 using generator 19, due to the trapezoidal shape of the resonator 2, longitudinal and bending modes of oscillation are simultaneously excited in the system, whose interaction causes an ellipsoidal oscillation (FIGS. 3A-3C) of the contact point (line), resulting in rotation of the rotor 12. The advantages of this type of resonator have been already referred to above. However, there still remains the risk of the rotor 12 developing beating, internal or external vibrations, which might lead to the actuator 1 separating from the rotor 12 momentarily (with their friction engagement interrupted) and the system's Q factor sharply rising for brief periods of time. To minimize the probability of this destructive effect, the suspension 14 of the actuator 1 is designed in the form of an elastic rotational cantilever 17. This would minimize the effect of beating of the rotor 12 upon the actuator 1 and also would reduce the effect of undesired vibration upon the actuator 1. Thus, the cantilever rod 17, owing to its elasticity, would counteract beating of the rotor 12 and decrease undesired vibrations, and would significantly increase the power pumped into the motor and its reliability (by preventing eventual sharp rise of the Q factor and effects of destructive mechanical stress).

The pull spring 18 has its one end attached to the holder 16 of the actuator 1 and its other end to the base 10 of the rotor 12, which as explained above, increases the operational Q factor of the system, whereas in the prior art the spring would press or pull the actuator itself at the place of its maximum oscillation amplitude, thus decreasing the Q factor of the actuator, and hence, the power efficiency of the system. In the present invention, the pulling of the spring 18 takes place virtually through the centre of the actuator 1 where its oscillation amplitude is at its minimum, and so the damping action from the spring force is likewise at the minimum.

In a preferable embodiment, the pusher 3 is made of a paper-based laminate (e.g. phenolic paper) and the rotor 12 is made of steel, however, other materials may be utilized. For the sake of maximum power efficiency, the actuator 1 should engage the rotor at an angle close to 90°, i.e. the angle between the plane of the pusher 3 and a plane tangential to the rotor 12 along the line of contact with the rotor 12.

If the first-order natural mode along the length of the resonator is excited, the ends of the resonator would undergo maximum displacement while its center would remain steady. Thus, for increasing the operational Q factor and, hence, the power efficiency, the piezoelectric actuator 1 is secured at its center to the holder 16 through gaskets 15 matching the shape of the resonator 2 and made of a sound-insulating or sound-proof material, e.g. of foamed polyurethane, or other vibration reducing material. Such gaskets 15 minimize the loss of oscillation energy by providing oscillation insulation from the holder 16 and, thus, from the base 10 of the motor. For establishing of the initial mating of the pusher 3 with the cylindrical surface of the rotor 12 in the process of adjustment, the gaskets 15 are preferably formed as U-shape guides providing for additional motion of the actuator 1 normally to the axis of the rotor 12, prior to finally securing the actuator 1 in the holder 16.

Figure 6:
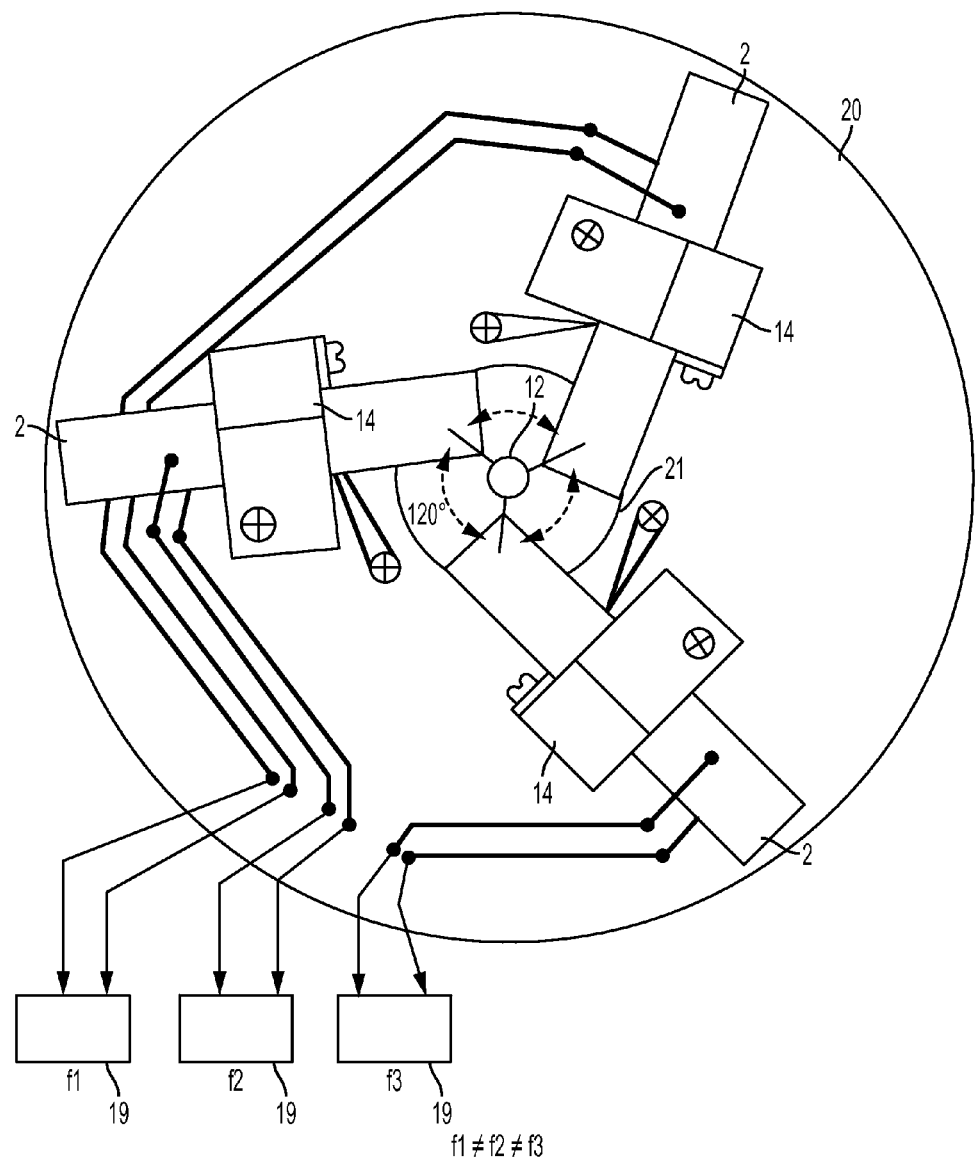
FIG. 6 is top plan view of a motor in accordance with another exemplary embodiment of the invention with the common rotor engaged by three actuators.

FIG. 6 shows a piezoelectric motor with three identical actuators 1 for simultaneous engagement with the rotor 12. This design increases the operational torque of the motor and improves its load curve. While the actuators 1 are preferably identical, it is recognized that the actuators may have differing configurations based on the application. Additionally, while three actuators 1 are shown in the exemplary embodiment, more or fewer than three may be utilized.

In the illustrated embodiment, each resonator 2 is mounted via its own suspension 14 on a round flat elastic membrane 20, with each actuator 2 being connected to is own generator of electrical excitation 19. The working end of each actuator is pressed to the rotor 12 by its own pull spring.

The three piezoelectric actuators 1 are in their holder so that the respective pushers 3 are preferably at an angle of 120° relative to one another.

To increase the torque, two or more piezoelectric actuators, simultaneously acting on the common rotor, would be generally used. Preferably, all individual actions are in-phase, i.e. synchronized in time. This would enable an increase in the total torque without increasing the rotor diameter and thus without decreasing the rotational speed of the motor. However, as the time of interaction of the actuator with the rotor would not exceed few tens of microseconds (the excitation period of the piezoelectric resonator), it is difficult to achieve synchronous timing of all of resonators, to make them in-phase.

In order to provide in-phase operation, as a minimum, all three generators must be operated synchronously, i.e. providing a zero time shift between their electrical excitation signals. However, as our experience has indicated, electrical synchronism of operation of the generators is not sufficient to assure mechanical synchronism (i.e. simultaneous pushing of the rotor by all actuators).

This is caused by numerous structural and physical factors related to the system (different Q factors of the actuators, lack of compensation of the forces applied to the rotor, elasticity of the rotor, varying elasticity across the surface area of the system, alignment errors in the system, radial play of the axis of the rotor, rotor's and system's own oscillation frequency, etc.) that may not be fully accounted for in practice.

Thus, in order to enhance operational efficiency of the system with three actuators, the system further comprises an inertial motion integrator in the form of a cylindrical flywheel 21 secured with the rotor 12 to integrate non-synchronous pushes by individual actuators resulting in a smooth operation of the rotor.

This does not eliminate the need for frequency pre-tuning of each actuator for maximum speed of rotation, taking into account all structural and physical factors.

The performance of the motor may be considerably enhanced by the elastic membrane base 20. The base 20, in form of a thin round plate, serves to compensate for any beating of the rotor 12, and at the same time integrate out any residual dynamic forces implied by the three independent actuator assemblies.

The actuator 1 acts on the rotor 12 through the pusher 3 applying a force directed radially to the rotor surface. The effect of the three symmetrically arranged actuators acting on the rotor is equivalent to three forces converging at 120°, which in an ideal system would equal a zero resultant force. In reality, these forces may not always be self compensating, so causing some flexing of the rotor. This problem becomes more complicated in a dynamic system, which would result in complex motion of the rotor in space, equivalent to a beating of the rotor along a complex three dimensional curve. This might cause irregularities in operation of the motor, or even its failure.

The elastic membrane 20 counteracts such parasitic beating of the rotor, thus significantly enhancing the efficiency of the entire motor.

Therefore, this system comprises three independent generators 19, which, with appropriate frequency pre-tuning of each, provides optimal phase synchronization of the piezoelectric actuators 1 with respect to one another and with the elastic oscillation of the membrane 20 and of the system as a whole, accounting for the inertial properties of the integrator.

Each electronic generator 19 is designed to provide an alternating electrical voltage at a frequency matching the frequency of the first-order natural longitudinal mode of mechanical oscillation along the length of the corresponding resonator. However, the frequencies $f_1$, $f_2$, $f_3$ of the three independent generators 19 are preferably varied to account for phase adjustment of the respective actuators and of the system as a whole.

In another aspect, all of the components of the motor may be made of non-magnetic materials. The structure of the disclosed motor is such that it can be made as a non-magnetic motor since its basic component, i.e. its piezoelectric actuator is non-magnetic. In an exemplary non-magnetic assembly, the rotor is made of non-magnetic stainless steel; its axis system based on either ceramic bearings or bronze-graphite bearing sleeves; its flywheel is of brass or bronze; its springs are of non-magnetic materials, e.g. beryllium bronze or rubber; and the rest of the housing components are made of aluminum. The invention is not limited to the materials described in this exemplary assembly.

As demonstrated by the testing of a pilot specimen made in accordance with the present invention, with electrical power of excitation of about 12 W, the rotational idling speed of the motor was about 2500 rpm. Moreover, with a working load of about 200 g*cm, the operational speed was as high as 1500 rpm with an entirely non-magnetic implementation of the motor.

SPECIFICATIONS

1—piezoelectric actuator;
2—piezoelectric trapezoidal resonator;
3—flat pusher;
4, 5—excitation electrodes of the resonator;
6—resonator base
7, 8—resonator sides
10—base of the motor;
12—rotor-shaft;
13—bearings (guides);
14—rotational suspension;
15—soundproof gaskets;
16—holder of the piezoelectric actuator;
17—threaded elastic cylindrical cantilever rod;
18—pull spring;
19—generator of electrical excitation;
20—elastic flat round (circular) membrane;
21—flywheel.

What is claimed is:

1. A piezoelectric motor comprising:
a rotor with an outer working cylindrical surface set for rotation relative to a motor base;
a piezoelectric actuator positioned relative to the rotor in such manner that a working end of the actuator is in linear, frictional, resilient and forced contact with the working surface of the rotor, the piezoelectric actuator including a piezoelectric resonator made in the shape of a longitudinal prism with a trapezoidal cross-section having longitudinal lateral surfaces and a base surface and the working end of the actuator is a flat pusher insert set at an angle to the plane of the resonator base; and
an electronic generator connected to electrodes of the piezoelectric actuator to excite periodic mechanical oscillations in the actuator;
wherein the electrodes are applied onto the longitudinal lateral trapezoidal surfaces of the resonator and the piezoelectric resonator is polarized across its width, parallel to the resonator base, and the electronic generator outputs an alternating electrical voltage signal at a frequency matching the frequency of the first-order natural longitudinal mode of mechanical oscillation along the length of the resonator.

2. The piezoelectric motor as claimed in claim 1, wherein the pusher is set at an angle of about 135° to the plane of the base of the resonator.

3. The piezoelectric motor as claimed in claim 1, wherein the pusher is made of a paper-based laminate.

4. The piezoelectric motor as claimed in claim 3, wherein the pusher is made of phenolic paper.

5. The piezoelectric motor as claimed in claim 3, wherein the rotor is made of steel.

6. The piezoelectric motor as claimed in claim 1, wherein the piezoelectric actuator is mounted on the motor base and positioned relative to the rotor via a rotational suspension.

7. The piezoelectric motor as claimed in claim 6, wherein the rotational suspension includes a holder of the piezoelectric actuator with a threaded opening, and a threaded elastic cylindrical cantilever rod having one extremity fast with the motor base and its other extremity fast with the threaded opening in the actuator holder.

8. The piezoelectric motor as claimed in claim 7, wherein an axis of rotation of the rotor is parallel to the axis of the cantilever rod.

9. The piezoelectric motor as claimed in claim 7, wherein the threaded connection of the holder and the cantilever rod provides for positioning of the actuator in a free of backlash manner axially of the rotor while retaining a rotational degree of freedom.

10. The piezoelectric motor as claimed in claim 7, wherein the piezoelectric actuator is held fast in the holder at the center of the resonator via oscillation reducing gaskets.

11. The piezoelectric motor as claimed in claim 10, wherein the gaskets are made of foamed polyurethane.

12. The piezoelectric motor as claimed in claim 10, wherein the gaskets are configured to facilitate pre-positioning the actuator normal to the rotor axis.

13. The piezoelectric motor as claimed in claim 7, wherein frictional, resilient engagement of the pusher and the rotor is provided for by a pull-spring having its one end attached to the motor base and its other end to the rotational holder of the actuator.

14. The piezoelectric motor as claimed in claim 1, wherein the piezoelectric actuator is positioned with respect to the rotor so that the angle between the flat pusher and a plane tangent to the rotor surface at the line of engagement is 90°.

15. The piezoelectric motor as claimed in claim 1, including three piezoelectric actuators mounted on the motor base positioned about the rotor.

16. The piezoelectric motor as claimed in claim 15, wherein each piezoelectric actuator is positioned so that the respective pushers are at an angle of 120° relative to one another.

17. The piezoelectric motor as claimed in claim 15, wherein the rotor carries an inertial load in the form of a cylindrical flywheel.

18. The piezoelectric motor as claimed in claim 15, wherein the motor base is in the form of a round flat elastic membrane.

19. The piezoelectric motor as claimed in claim 15, wherein each actuator is associated with its own independent electronic generator configured for fine-tuning of the frequency of the electric excitation signal of each actuator.

20. The piezoelectric motor as claimed in claim 15, wherein the frequency of excitation signal of each actuator is close to the frequency of the first-order natural longitudinal mode of mechanical oscillation along the length of the respective resonator.

21. The piezoelectric motor as claimed in claim 1, including more than three piezoelectric actuators mounted on the motor base positioned about the rotor.

22. The piezoelectric motor as claimed in claim 1, wherein the rotor, the motor base and the piezoelectric actuator are made of non-magnetic materials.

23. The piezoelectric motor as claimed in claim 22, wherein the rotor is made of stainless steel, the bearing guides are ceramic bearings and the motor base is made of aluminum.

24. The piezoelectric motor as claimed in claim 23, further comprising a flywheel made of bronze or brass and one or more spring members made of either bronze or of silicon rubber.

25. The piezoelectric motor as claimed in claim 1, wherein a ratio of the width of the resonator base to the thickness of the resonator is greater than 1 and less than 4.

* * * * *